United States Patent
Kondo et al.

(10) Patent No.: US 6,897,559 B2
(45) Date of Patent: May 24, 2005

(54) SILICON-BASED THIN FILM FORMING APPARATUS, SILICON-BASED THIN FILM FORMING METHOD AND SEMICONDUCTOR ELEMENT

(75) Inventors: Takaharu Kondo, Kyoto (JP); Akira Sakai, Kyoto (JP); Koichi Matsuda, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 108 days.

(21) Appl. No.: 10/455,300

(22) Filed: Jun. 6, 2003

(65) Prior Publication Data
US 2003/0227082 A1 Dec. 11, 2003

(30) Foreign Application Priority Data
Jun. 10, 2002 (JP) ........................................ 2002/168554

(51) Int. Cl.[7] .............................................. H01L 23/34
(52) U.S. Cl. ........................ 257/728; 257/461; 257/463; 438/57; 438/59; 438/60; 438/98
(58) Field of Search ................................. 257/461, 463; 438/57, 58–98

(56) References Cited

U.S. PATENT DOCUMENTS

| | | | |
|---|---|---|---|
| 4,800,174 A | 1/1989 | Ishihara et al. | 437/101 |
| 5,589,007 A | 12/1996 | Fujioka et al. | 136/249 |
| 5,676,765 A | 10/1997 | Saito et al. | 136/258 |
| 5,720,826 A | 2/1998 | Hayashi et al. | 136/249 |
| 6,153,013 A | 11/2000 | Sakai et al. | 118/719 |
| 6,162,988 A | 12/2000 | Okabe et al. | 136/258 |
| 6,271,055 B1 | 8/2001 | Yajima et al. | 438/97 |
| 6,326,304 B1 | 12/2001 | Yoshimi et al. | 438/680 |
| 6,368,944 B1 | 4/2002 | Okabe et al. | 438/482 |
| 6,399,411 B1 | 6/2002 | Hori et al. | 438/62 |
| 6,495,392 B2 * | 12/2002 | Sakai et al. | 438/96 |
| 6,515,219 B2 | 2/2003 | Kondo | 136/256 |
| 2003/0143822 A1 | 7/2003 | Kondo et al. | 438/485 |

FOREIGN PATENT DOCUMENTS

| | | |
|---|---|---|
| JP | 5-56850 | 8/1993 |
| JP | 2000-252484 | 9/2000 |

* cited by examiner

Primary Examiner—David Nelms
Assistant Examiner—Mai-Huong Tran
(74) Attorney, Agent, or Firm—Fitzpatrick, Cella, Harper & Scinto

(57) ABSTRACT

There is provided an apparatus for forming a plurality of silicon-based thin films on a substrate using a plurality of deposited film forming vessels that can form silicon-based thin films of higher quality and excellent uniformity by applying a high frequency power of a first frequency selected from the range between 30 MHz and 500 MHz to a power-applying electrode in a deposited film forming vessel wherein the distance between the power-supplying electrode and the substrate is 10 mm±5 mm, and by supplying a high frequency power of a second frequency selected from the range between 10 MHz and 30 MHz to a power-supplying electrode in a deposited film forming vessel wherein the distance between the power-supplying electrode and the substrate is 20 mm±5 mm.

10 Claims, 5 Drawing Sheets

SILICON-BASED THIN FILM FORMING APPARATUS, SILICON-BASED THIN FILM FORMING METHOD AND SEMICONDUCTOR ELEMENT

BACKGROUND OF THE INVENTION

1. Field of the Invention

The present invention relates to an apparatus and method for forming a silicon-based thin film using a high-frequency plasma CVD process and a semiconductor element comprising the silicon-based thin film.

2. Related Background Art

As a method of forming a silicon-based thin film, the high-frequency plasma process has the advantages of facilitating enlargement of area and formation at low temperatures and increasing process throughput and is thus one of predominant means for mass production.

Considering the production of solar cells as an example of semiconductor elements comprising a silicon-based thin film, when compared with existing energy utilizing fossil fuels, the solar cells using the silicon-based thin films have the advantages of inexhaustible energy sources and clean power generation processes, but it is necessary to further reduce the unit cost per generated power, in order to make them widespread. Technological subjects significant for realizing the cost reduction involve establishment of such techniques as to improve the throughput of the high-frequency plasma CVD process to increase the photoelectric conversion efficiency and to secure a high uniformity when enlarged in area.

In view of the foregoing, there have recently been made various attempts to improve the production techniques of the high-frequency plasma process.

As a forming method for an amorphous silicon semiconductor element, Japanese Patent Publication No. 5-56850 discloses a method wherein the interelectrode distance when an amorphous layer of a large film thickness is formed is set smaller than the interelectrode distance when an amorphous layer of a small film thickness, and the substrate temperature and the vacuum degree are set higher.

Japanese Patent Application Laid-Open No. 2000-252484 discloses a method for manufacturing an amorphous silicon-based thin film photoelectric conversion device having a stack structure of pin, wherein at least one layer is formed under specific conditions, such as making the interelectrode distance 8 mm or more and 15 mm or less.

In a forming method for a silicon-based thin film on a substrate using a high-frequency plasma CVD method under the conditions of specific interelectrode distances is disclosed in the above-described prior art. However, formation of a silicon-based thin film using a plurality of frequencies depending on a silicon-based thin film to be formed, as well as the relationship between the frequencies and the interelectrode distance, and the relationship with the conductivity type of the silicon-based thin film to be formed at that time are not disclosed.

SUMMARY OF THE INVENTION

It is, therefore, an object of the present invention to provide an apparatus for forming a plurality of silicon-based thin films comprising a plurality of silicon-based thin films of different conductivity types that can uniformly form silicon-based thin films of higher quality, by using a plurality of frequencies depending on a film to be formed, specifically defining an interelectrode distance, and defining the relationship with the conductivity type of a silicon-based thin film to be formed; a method of forming such silicon-based thin films; and a semiconductor element containing such silicon-based thin films.

According to a first aspect of the present invention, there is provided an apparatus for forming a silicon-based thin film on a substrate using a plurality of deposited film forming vessels by a high-frequency plasma process, comprising a substrate and a high frequency applying electrode disposed in opposition to each other in each of the deposited film forming vessels, wherein the plurality of deposited film forming vessels including a first deposited film forming vessel having a first high-frequency applying electrode disposed so as to be distant by 10 mm±5 mm from the substrate and a first means for applying high-frequency waves of a first frequency selected from the range between 30 MHz and 500 MHz connected to the first high-frequency applying electrode, and a second deposited film forming vessel having a second high-frequency applying electrode disposed so as to be distant by 20 mm±5 mm from the substrate and a second means for applying high-frequency waves of a second frequency less than the first frequency selected from the range between 10 MHz and 30 MHz connected to the second high-frequency applying electrode.

According to a second aspect of the present invention, there is provided a method of forming a silicon-based thin film on a substrate using a plurality of deposited film forming vessels by a high-frequency plasma process in a state such that the substrate and a high frequency applying electrode are disposed in opposition to each other in each of the deposited film forming vessels, the method comprising a first step of forming a deposited film while applying high-frequency waves of a first frequency selected from the range between 30 MHz and 500 MHz through a first high-frequency applying electrode disposed so as to be distant by 10 mm±5 mm from the substrate, and a second step of forming a deposited film while applying high-frequency waves of a second frequency less than the first frequency selected from the range between 10 MHz and 30 MHz through a second high-frequency applying electrode disposed so as to be distant by 20 mm±5 mm from the substrate.

According to a third aspect of the present invention, there is provided a semiconductor element comprising a silicon-based thin film formed on a substrate, the silicon-based thin film being formed by a method of forming a silicon-based thin film on a substrate using a plurality of deposited film forming vessels by a high-frequency plasma process in a state such that the substrate and a high frequency applying electrode are disposed in opposition to each other in each of the deposited film forming vessels, comprising a first step of forming a deposited film while applying high-frequency waves of a first frequency selected from the range between 30 MHz and 500 MHz through a first high-frequency applying electrode disposed so as to be distant by 10 mm±5 mm from the substrate, and a second step of forming a deposited film while applying high-frequency waves of a second frequency less than the first frequency selected from the range between 10 MHz and 30 MHz through a second high-frequency applying electrode disposed so as to be distant by 20 mm±5 mm from the substrate.

It is preferable that a long substrate is used as the substrate, and a roll-to-roll system that transports the long substrate by bridging between rolls is installed. In the first step, it is preferable to form a substantially intrinsic silicon-based thin film. In the second step, it is preferable to form a silicon-based thin film having an n- or p-type conductivity. It is preferable to form a pin-type semiconductor element on the substrate using a step of forming a substantially intrinsic silicon-based thin film and a step for forming a silicon-based thin film having an n- or p-type conductivity.

DESCRIPTION OF THE PREFERRED EMBODIMENTS

Figure 1:
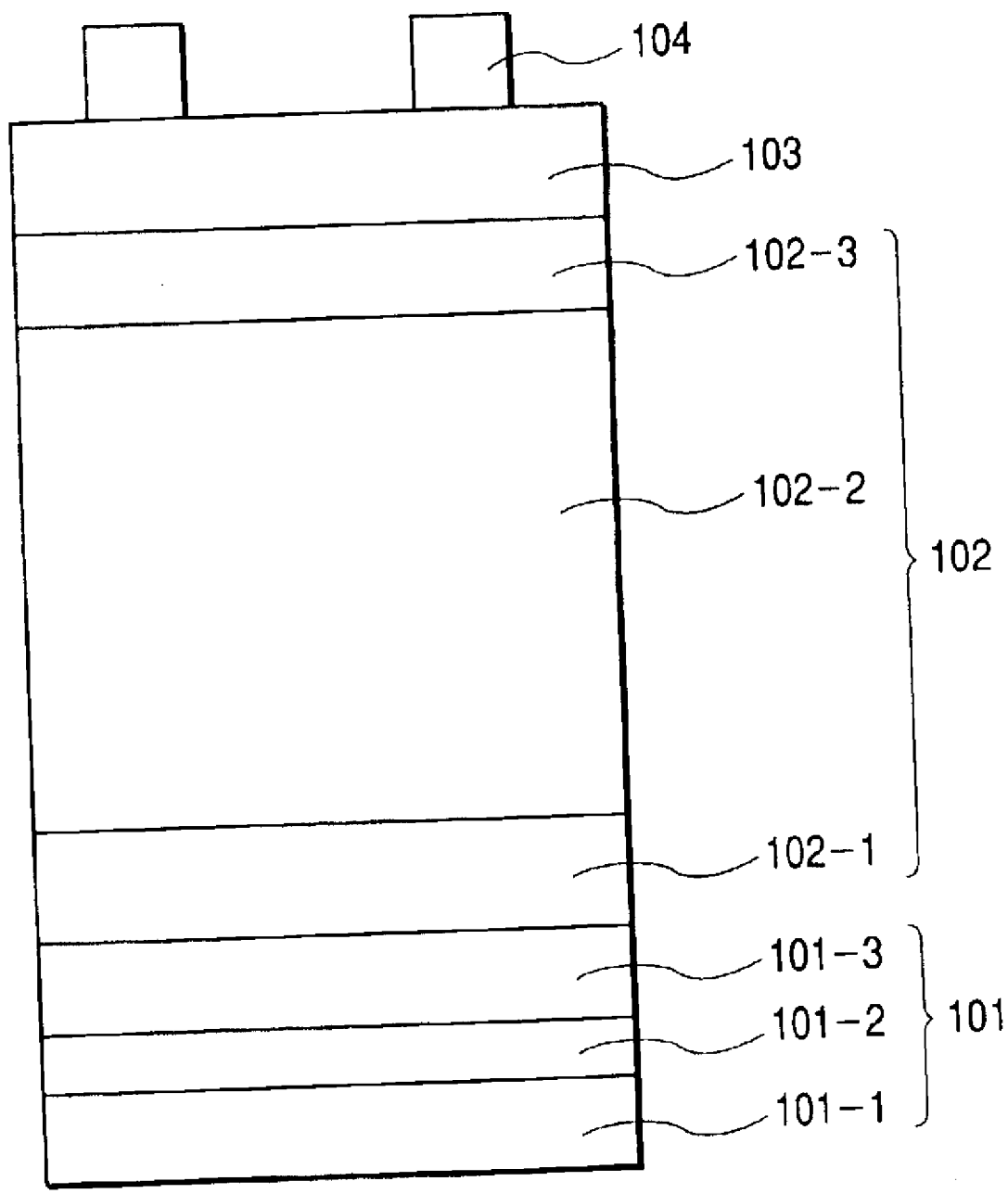
FIG. 1 is a schematic sectional view showing an example of the photovoltaic element in accordance with the present invention.

The present inventors have conducted extensive studies to solve the above-described problems, and found that in the formation of a plurality of silicon-based thin films on a substrate using a plurality of deposited film forming vessels, silicon-based thin films having a higher quality and excellent uniformity can be formed by the constitution wherein a high-frequency power of a first frequency selected from the range between 30 MHz and 500 MHz is supplied to a power supplying electrode disposed in the deposited film forming vessel so that the distance between the power supplying electrode and the substrate was 10 mm±5 mm, and a high-frequency power of a second frequency selected from the range between 10 MHz and 30 MHz is supplied to the power supplying electrode disposed in the deposited film forming vessels so that the distance between the power supplying electrode and the substrate is 20 mm±5 mm; and that a semiconductor element having excellent characteristics can be formed by the combination of these silicon-based thin films to attain the present invention.

The above-described constitution has the following actions.

From the viewpoint of the throughput of the manufacturing process to form a semiconductor element by fabricating silicon-based thin films having variations in film thickness, conductivity type and the like using a plurality of deposited film forming vessels, silicon-based thin films that require a large film thickness of the plurality of silicon-based thin films need to be formed at a relatively high film-forming rate. In the method of forming silicon-based thin films using a high-frequency plasma CVD process, the elevation of the film-forming rate can be realized by forming reactive species contributing to the deposited film formation in a high density.

Reactive species contributing to the deposited film formation can be formed in a high density using a method of increasing a plasma density by decreasing a distance between a power supplying electrode and a substrate, or a method of raising the decomposition efficiency of source gases by increasing the frequency of the high frequency power.

An important technical factor for forming high-quality films is to control the residence time of source gases so as to sufficiently supply the source gases without depletion.

It is preferable from the above viewpoint to form silicon-based thin films by selectively using a plurality kinds of high frequency waves of different frequencies, specifically, high frequency waves of a first frequency selected from the range between 30 MHz and 500 MHz or high frequency waves of a second frequency selected from the range between 10 MHz and 30 MHz, and setting an adequate distance between a power supplying electrode and a substrate suited for each frequency.

The first frequency is larger than the second frequency and is preferably used to form a silicon-based thin film at a higher deposition rate.

Here, there is a problem that if the first frequency is less than 30 MHZ, the decomposition efficiency of source gases is low and high-speed film formation is difficult; and if the first frequency is more than 500 MHZ, it is difficult to supply an electric power uniformly with suitable matching by use of a large power-applying electrode.

In the case of using either preferable high-frequency waves as mentioned above, the preferable film-forming conditions for sufficiently carrying out a vapor-phase reaction and for inhibiting the depletion of source gases to form a high-quality silicon-based thin film are such that the pressure when forming a silicon-based thin film is 10 Pa or more and 1000 Pa or less, and that when the volume of a discharge space wherein a plasma generates represented as V ($m^3$), the flow rate of the source gas is represented as Q ($cm^3$/min (standard conditions)), and the pressure inside the discharge space is represented as P (Pa), the residence time $\tau$ (sec) defined by $\tau = 592 \times V \times P/Q$ is between 0.01 second and 10 seconds. The residence time $\tau$ (sec) is more preferably between 0.1 second and 3 seconds for enabling high-speed film formation, and for inhibiting formation of reaction by-products such as polysilane in the vapor phase.

When a silicon-based thin film is formed using high-frequency waves of the first frequency selected from the range between 30 MHz and 500 MHz, by making the distance between the power supplying electrode and the substrate 10 mm±5 mm, and when a silicon-based thin film is formed using high-frequency waves of the second frequency selected from the range between 10 MHz and 30 MHz, by making the distance between the power supplying electrode and the substrate 20 mm±5 mm, a plasma of a density suited to each discharge can be uniformly and stably formed, so that silicon-based thin films of desired film quality can be obtained at a desired film-forming rate.

When a photovoltaic element having a pin junction is taken here as an example of a semiconductor element comprising silicon-based thin films, the i-type semiconductor layer having a larger film thickness of the p-type semiconductor layer, the i-type semiconductor layer and the n-type semiconductor layer is preferably formed by disposing the power-applying electrode and substrate such that the distance therebetween becomes 10 mm±5 mm, and by applying a high frequency power of the first frequency selected from the range between 30 MHz and 500 MHz; and the p-type semiconductor layer and the n-type semiconductor layer are preferably formed by disposing the power-supplying electrode and substrate such that the distance therebetween becomes 20 mm±5 mm, and by applying a high frequency power of the second frequency selected from the range between 10 MHz and 30 MHz. As another effect of this constitution, when the p-type semiconductor layer and the n-type semiconductor layer are formed using the second frequency, the doping effect is improved, the internal electric field at the pin junction is improved, and the open-circuit voltage and the fill factor are improved, compared with the case of forming these layers using the first frequency. This is considered because when the high frequency power of the second frequency, which is a lower frequency, is used, the electron temperature inside the generated plasma elevates relatively, whereby the film-forming surface of the silicon-based thin film is activated.

Here, because the above-described effects are exhibited if the power-supplying electrode and the substrate are disposed such that the distance therebetween becomes 10±5 mm, and a most region of the i-type semiconductor layer is formed by applying the high frequency power of the first frequency selected from the range between 30 MHz and 500 MHz, it is not necessarily required to form the whole region of the i-type semiconductor layer under the above-described conditions. Similarly, it is sufficient if the power-supplying electrode and the substrate are disposed such that the distance therebetween becomes 20±5 mm, and most regions of the n-type semiconductor layer and the p-type semiconductor layer are formed by applying the high frequency power of the second frequency selected from the range between 10 MHz and 30 MHz, and it is not necessarily required to form the whole regions of the n-type semiconductor layer and the p-type semiconductor layer under the above-described conditions. For example, in the boundary region(s) of the i-type semiconductor layer, and the p-type semiconductor layer and/or the n-type semiconductor layer, the constitution may be adopted wherein the power-applying electrode and the substrate are disposed such that the distance therebetween becomes 20±5 mm, and a partial region of the i-type semiconductor layer is formed by applying the high frequency power of the second frequency selected from the range between 10 MHz and 30 MHz; or the constitution may be adopted wherein the power-supplying electrode and the substrate are disposed such that the distance therebetween becomes 10±5 mm, and partial region(s) of the n-type semiconductor layer and/or the p-type semiconductor layer is formed by applying the high frequency power of the first frequency selected from the range between 30 MHz and 500 MHz may be employed.

It is also preferable to use the roll-to-roll system as the forming method for silicon-based thin films. The roll-to-roll system is a preferable means for producing silicon-based thin films with high productivity, wherein a plurality of deposited film forming vessels are disposed along a path through which a sufficiently long belt-like substrate successively passes, and necessary deposited films are formed in the respective deposited film forming vessels while moving the substrate in its longitudinal direction, thereby enabling continuous formation of desired deposited films in a large area.

When a semiconductor element containing a plurality of silicon-cased thin films is formed using the roll-to-roll system, the relationship between the size of the vessel for forming deposited films forming each layer, the required film thickness and the film-forming rate is an important parameter in order to form respective silicon-based thin films while transporting the substrate. However, because the constitution of the present invention makes it possible to form a silicon-based thin film that requires a large thickness at a high speed, the size of the deposited film forming apparatus can be reduced. Incidentally, in the roll-to-roll system, if the system has a configuration such that the respective deposited film forming vessels are connected to each other with gas gates or other means therebetween so that the source gases of the adjacent deposited film forming vessels do not substantially mix with each other, the respective deposited film forming vessels can be considered as a plurality of separate deposited film forming vessels.

Next, each of components will be described below, using an example of a photovoltaic element as the semiconductor element having a silicon-based thin film of the present invention.

FIG. 1 is a schematic, cross-sectional view showing an example of the photovoltaic element according to the present invention. In the figure, reference numeral 101 designates a substrate, 102 a semiconductor layer, 103 a transparent conductive layer, and 104 a collector electrode. Further, numeral 101-1 denotes a base member, 101-2 a metal layer, and 101-3 a metal oxide layer. These are constitutive members of the substrate 101.

(Base Member)

The base member 101-1 is suitably selected from platelike members and sheetlike members of metal, resin, glass, ceramics, semiconductor bulks, and so on. The surface of the base member may have fine unevenness. It is also possible to employ a transparent base member in a configuration where light is incident from the base member side. When the base member is of an elongated shape, it is feasible to perform continuous film formation by the Roll to Roll system. Particularly, a flexible material such as stainless steel, polyimide, or the like is suitably used as a material of the base member 101-1.

(Metal Layer)

The metal layer 101-2 serves as an electrode and also serves as a reflecting layer that reflects the light reaching the base member 101-1 to utilize the reflected light again in the semiconductor layer 102. The material of the metal layer can be suitably selected from Al, Cu, Ag, Au, CuMg, AlSi, and so on. A method of forming the metal layer can suitably be selected from methods such as evaporation, sputtering, electrodeposition, printing, and so on. The metal layer 101-2 preferably has an unevenness in the surface thereof. The unevenness can expand the optical path length of a reflected light in the semiconductor layer 102, so as to increase the short circuit current.

(Metal Oxide Layer)

The metal oxide layer 101-3 functions to enhance diffuse reflection of the incident light and reflected light and expand the path lengths thereof in the semiconductor layer 102. It also functions to prevent the element of the metal layer 101-2 from diffusing or migrating into the semiconductor layer 102 to shunt the photovoltaic element. Further, the metal oxide layer 101-3 has a moderate resistance, whereby it functions to prevent a short circuit due to defects such as pinholes or the like in the semiconductor layer. Further, the metal oxide layer 101-3 desirably has an unevenness in the surface thereof as the metal layer 101-2 does. The metal oxide layer 101-3 is preferably comprised of a conductive oxide such as ZnO, ITO, or the like and is preferably made by a method such as evaporation, sputtering, CVD, electrodeposition, or a combination thereof. It is also possible to add a material capable of changing the conductivity to these conductive oxides. When forming the metal oxide layer, it is preferable to reduce the forming rate of the metal oxide layer in a region thereof being in contact with the metal layer. Further, it is also preferable to incorporate oxygen into a film forming atmosphere during formation of a region of the metal oxide layer being in contact with the metal layer.

Among conditions for forming the metal layer 101-2 and metal oxide layer 101-3 by sputtering, those causing significant effect include the method, type and flow rate of gas, internal pressure, input power, film-forming rate, substrate temperature, and so on. For example, where the zinc oxide film is made by the DC magnetron sputtering method using a zinc oxide target, the type of gas is selected from Ar, Ne, Kr, Xe, Hg, $O_2$, and so on, and the flow rate depends upon the size of the apparatus and the exhaust rate; for example, in the case of the film-forming space having the volume of 20 l, the flow rate is desirably 1 $cm^3$/min (standard conditions) to 100 $cm^3$/min (standard conditions). The internal pressure during the film formation is desirably 10 mPa to 10 Pa. Although depending upon the size of the target, the input power is desirably 10 W to 10 kW in the case of the diameter of 15 cm. The preferred range of the substrate temperature varies depending upon the film-forming rates, but in the case of the film formation at 1 $\mu$m/h, it is desirably 70° C. to 450° C.

Preferred conditions for formation of a zinc oxide film as an example of the metal oxide layer by the electrodeposition method is use of an aqueous solution containing nitric ions and zinc ions in a corrosion-resistant vessel. Concentrations of nitric ions and zinc ions are desirably in the range of 0.001 mol/l to 1.0 mol/l, more desirably in the range of 0.01 mol/l to 0.5 mol/l, and still more desirably in the range of 0.1 mol/l to 0.25 mol/l. There are no specific restrictions on supply sources of the nitric ions and zinc ions, and the supply source may be zinc nitrate as a supply source of the both ions or a mixture of a water-soluble nitrate, such as ammonium nitrate or the like, as a supply source of nitric ions and a zinc salt, such as zinc sulfate or the like, as a supply source of zinc ions. Further, it is also preferable to add a carbohydrate to these aqueous solutions in order to suppress abnormal growth or enhance the adhesion. There are no specific restrictions on the type of the carbohydrate, and it can be selected from monosaccharides such as glucose (grape sugar), fructose (fruit sugar), and so on; disaccharides such as maltose (malt sugar), saccharose (cane sugar), and so on; polysaccharides such as dextrine, starch, and so on; and mixtures of these. An amount of the carbohydrate in the aqueous solution is determined depending upon the type of the carbohydrate, but it is approximately desirably in the range of 0.001 g/l to 300 g/l, more desirably in the range of 0.005 g/l to 100 g/l, and still more desirably in the range of 0.01 g/l to 60 g/l. When the zinc oxide film is deposited by the electrodeposition method, it is preferable to use the base member, onto which the zinc oxide film is to be deposited, as a cathode in the aqueous solution and use zinc, platinum, carbon, or the like as an anode. The current density through the load resistance at this time is preferably 10 mA/dm to 10 A/dm.

(Substrate)

By the above-described methods, the substrate 101 is formed by stacking the metal layer 101-2 and the metal oxide layer 101-3 on the base member 101-1 as occasion demands. For facilitating integration of elements, the substrate 101 may be provided with an insulating layer.

(Semiconductor Layer)

As a principal material of the silicon-based semiconductor and the semiconductor layer 102 in the present invention, there is used Si of an amorphous or crystalline phase, or a mixed phase thereof. In place of Si, an alloy of Si with C or Ge may also be used. The semiconductor layer 102 also contains hydrogen and/or halogen atoms. A preferable content thereof is 0.1 to 40 atomic %. The semiconductor layer 102 may further contain oxygen, nitrogen, or the like. For making the semiconductor layer as a p-type semiconductor layer, the semiconductor layer is made to contain a III-element, and for making it as an n-type semiconductor layer, the semiconductor layer is made to contain a V-element.

As the electric property of the p-type layer and the n-type layer, the activation energy is preferably not more than 0.2 eV and most preferably not more than 0.1 eV. The resistivity is preferably not more than 100 $\Omega$cm and most preferably not more than 1 $\Omega$cm.

In the case of a stack cell (a photovoltaic element with a plurality of pin junctions), a preferred configuration is such that the bandgap is set wide for the i-type semiconductor layers of pin junctions close to the light incidence side and the bandgap becomes narrower with increase of distance from the light incidence side toward the distant pin junctions. Further, it is preferred that a minimum value of the bandgap of the i-type semiconductor layer is offset close to the p-type layer side with respect to the center in the layer thickness direction of the i-type semiconductor layer. A crystalline semiconductor with little absorption of light or a semiconductor with a wide bandgap is suitable for the doped layer (the p-type layer or the n-type layer) on the light incidence side.

The i-type semiconductor layer may preferably be comprised of an amorphous or crystalline phase, or a mixture of these phases. Examples of stack cells with a stack of two sets of pin junctions include combinations of i-type silicon-based semiconductor layers contained in respective pin junctions such as (amorphous semiconductor layer; semiconductor layer comprising crystalline phase) and (semiconductor layer comprising crystalline phase; semiconductor layer comprising crystalline phase) from the light incidence side. Examples of photovoltaic elements with a stack of three sets of pin junctions include combinations of i-type silicon-based semiconductor layers contained in respective pin junctions such as (amorphous semiconductor layer; amorphous semiconductor layer; semiconductor layer comprising crystalline phase) and (semiconductor layer comprising crystalline phase; semiconductor layer comprising crystalline phase; semiconductor layer comprising crystalline phase) from the light incidence side.

The i-type semiconductor layers are preferably those having such properties that the absorption coefficient ($\alpha$) at the wavelength (630 nm) of light is not less than 5000 $cm^{-1}$, the photoconductivity ($\sigma p$) under irradiation with artificial sunlight by a solar simulator (AM 1.5; 100 mW/$cm^2$) is not less than $10 \times 10^{-5}$ S/cm, the dark conductivity ($\sigma d$) is not more than $10 \times 10^{-6}$ S/cm, and the Urbach energy by the constant photocurrent method (CPM) is not more than 55 meV. The i-type semiconductor layers may be those slightly leaning to the p-type or the n-type.

The semiconductor layer 102 being the constitutive element of the present invention will be described in further detail. FIG. 1 is a schematic, cross-sectional view showing the semiconductor layer 102 having one set of pin junction as an example of the semiconductor layer of the present invention. In the figure, reference numeral 102-1 denotes an n-type semiconductor layer, and an i-type semiconductor layer 102-2 and a p-type semiconductor layer 102-3 are further stacked thereon. In case of a semiconductor layer comprising a plurality of pin junctions, it is preferred that at least one junction thereof has the above mentioned configuration.

(Method of Forming Semiconductor Layer)

The high-frequency plasma CVD process is suitable for forming the silicon-based thin film of the present invention. The following will describe a preferred example of the procedure for forming the semiconductor layer 102 by the high-frequency plasma CVD process.

(1) The interior of a deposited film forming chamber, which can be brought into a depressurized state, is depressurized to a predetermined deposition pressure.

(2) Material gases such as source gases, a diluting gas, etc. is introduced into the deposition chamber, and the interior of the deposition chamber is set to a predetermined deposition pressure while evacuating the interior of the deposition chamber by a vacuum pump.

(3) The substrate 101 is set at a predetermined temperature by a heater.

(4) High-frequency waves oscillated by a high-frequency power supply is introduced into the deposition chamber. The method of introducing the high-frequency waves into the deposition chamber can be selected from the method of guiding the high-frequency waves through a waveguide tube and via a dielectric port of alumina ceramics or the like into the deposition chamber, or the method of guiding the high-frequency waves through a coaxial cable and via a metal electrode into the deposition chamber.

(5) A plasma is induced in the deposition chamber to decompose the source gas and form a deposited film on the substrate 101 placed in the deposition chamber. This procedure is repeated plural times according to necessity to form the semiconductor layer 102.

Examples of the source gas suitable for the formation of the silicon-based thin film of the present invention include silicon containing gasifiable compounds such as $SiH_4$, $Si_2H_6$, $SiF_4$, and so on. For making alloy-based thin films, it is desirable to introduce a gasifiable compound containing Ge or C, such as $GeH_4$, $CH_4$, or the like. It is further preferred that the source gas is diluted with a diluting gas and introduced into the deposition chamber. Suitable examples of the diluting gas include $H_2$, He, etc. Further, a gasifiable compound containing nitrogen, oxygen, or the like may also be added as a source gas or diluting gas.

A dopant gas for changing the semiconductor layer into the p-type layer is selected from $B_2H_6$, $BF_3$, and so on. A dopant gas for changing the semiconductor layer into the n-type layer is selected from $PH_3$, $PF_3$, and so on. For depositing a layer with little absorption of light or a layer with a wide bandgap, such as a thin film of crystalline phase, SiC, or the like, it is preferable to increase the ratio of the diluting gas to the source gas and introduce the high-frequency wave in a relatively high power density.

(Transparent Conductive Layer)

The transparent conductive layer 103 functions as an electrode on the light incidence side and also functions as an antireflection film the thickness of which is set at an appropriate value. The transparent conductive layer 103 is required to have a high transmittance in the absorbable wavelength region of the semiconductor layer 102 and have a low resistivity. The transmittance of the layer 103 at 550 nm is preferably not less than 80% and more preferably not less than 85%. The material of the transparent conductive layer 103 can be suitably selected from ITO, ZnO, $In_2O_3$, and so on. The method of making the layer 103 can be suitably selected from such methods as evaporation, CVD, spraying, spin-on process, dipping, and so on. It is also possible to add a material capable of changing the conductivity to these materials.

(Collector Electrode)

The collector electrode 104 is laid on the transparent electrode 103 in order to increase the electricity collection efficiency. A method of forming the collector electrode 104 is suitably selected from a method of forming metal in an electrode pattern through use of a mask by sputtering, a method of printing a conductive paste or a soldering paste, a method of securing metal lines with an electroconductive paste, and so on.

Protective layers are sometimes formed on the both surfaces of the photovoltaic element as occasion may demand. At the same time as it, a reinforcing material such as a steel sheet or the like may also be used on the back side of the photovoltaic element (on the opposite side to the light incidence side).

EXAMPLES

In the examples below, the present invention will be described in further detail with reference to examples of depositing a silicon-based thin film using a deposited film forming apparatus and forming a photovoltaic element, but it is noted that these examples do not limit the essence of the present invention at all.

Example 1

Figure 2:
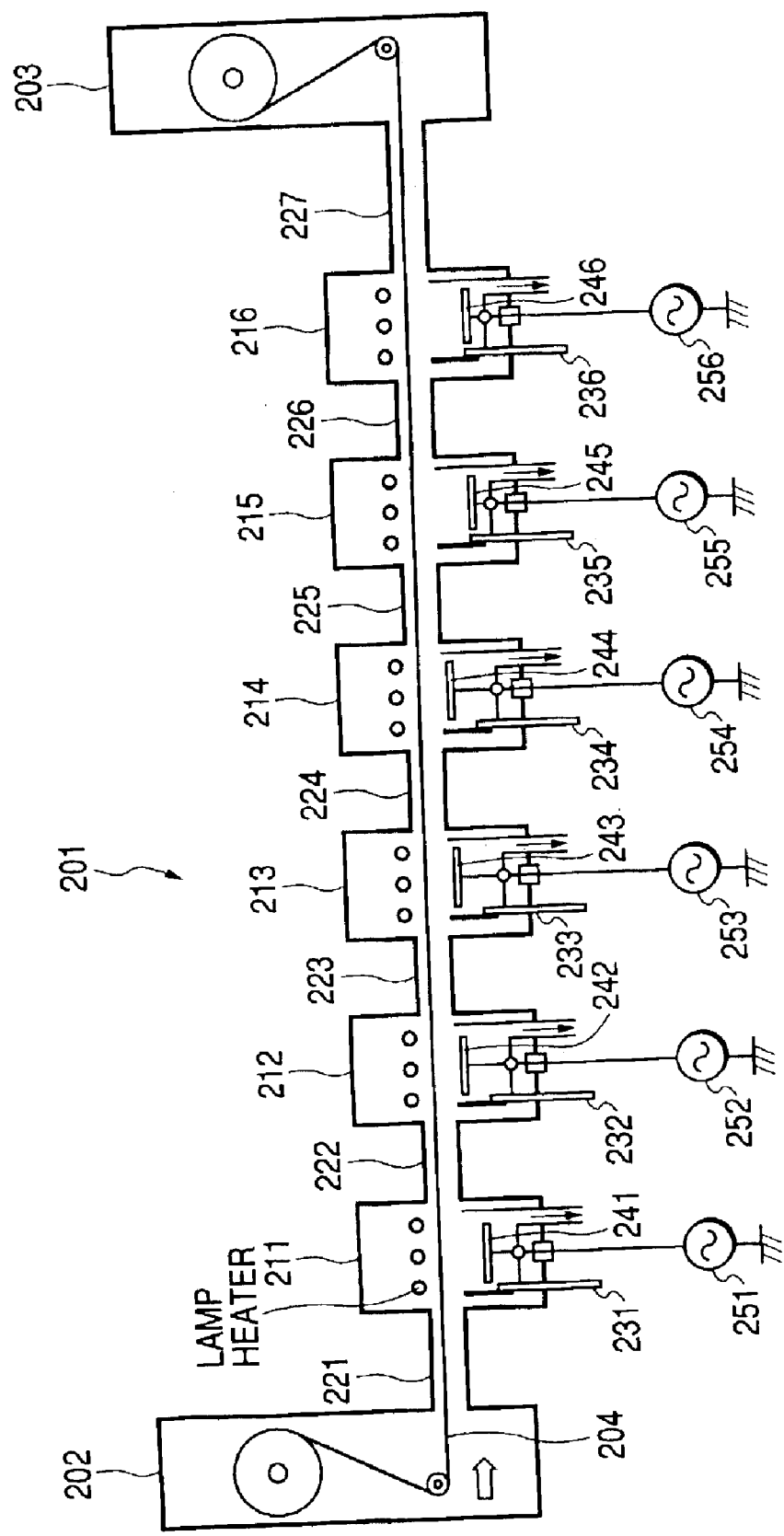
FIG. 2 is a schematic sectional view showing an example of the deposited film forming apparatus in accordance with the present invention.
Figure 3:
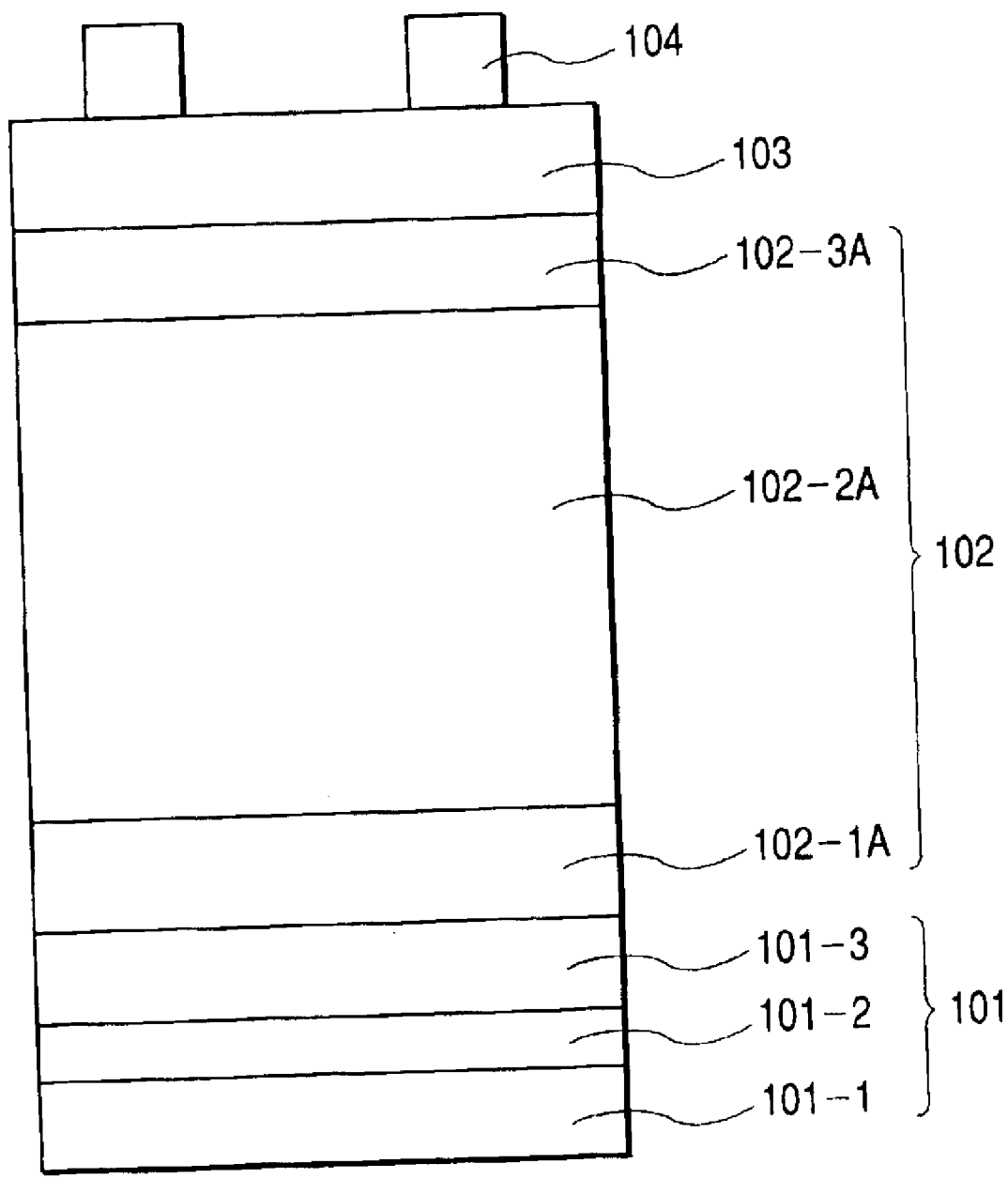
FIG. 3 is a schematic sectional view showing another example of the photovoltaic element in accordance with the present invention.

Using the deposited film forming apparatus 201 of the present invention shown in FIG. 2, a photovoltaic element of the configuration shown in FIG. 3 was made according to the following procedures.

FIG. 2 is a schematic, cross-sectional view showing an example of the deposited film forming apparatus for producing the silicon-based thin films and the photovoltaic element of the present invention used in this example. The deposited film forming apparatus 201 shown in FIG. 2 is constructed in such structure that a substrate feeding chamber 202, semiconductor forming vacuum chambers 211 to 216, and a substrate winding chamber 203 are coupled through gas gates 221 to 227. In this deposited film forming apparatus 201, the belt-like conductive substrate 204 is set through each chamber and each gas gate. The belt-like conductive substrate 204 is unwound from a bobbin placed in the substrate feeding chamber 202 and is wound up onto another bobbin placed in the substrate winding chamber 203.

Each of the semiconductor forming vacuum chambers 211 to 216 has a deposition chamber forming a plasma generating region. The deposition chamber is constructed so that the discharge space for the plasma to be induced is defined vertically by the conductive substrate 204 and the power applying electrode and laterally by a discharge plate mounted so as to surround the high-frequency introducing part.

The high-frequency power from high-frequency power supply 251 to 256 is applied to the platelike power applying electrodes 241 to 246 in the deposition chamber to induce glow discharge, and the source gas is decomposed thereby to deposit the semiconductor layer on the substrate 204. The power applying electrodes 241 to 246 are opposed to the conductive substrate 204 and are each provided with a height adjusting mechanism not shown. The height adjusting mechanism enables change in the distance between the conductive substrate 204 and each of the power applying electrodes 241 to 246 and change in the volume of the discharge space at the same time. A gas introducing pipe 231 to 236 for introducing the source gas and the diluting gas is connected to each semiconductor forming vacuum chamber 211 to 216.

Although the deposited film forming apparatus 201 shown in FIG. 2 is provided with the six semiconductor forming vacuum chambers, the glow discharge does not have to be induced in all the semiconductor forming vacuum chambers, and whether the glow discharge is to be induced in each chamber can be determined according to the layer configuration of the photovoltaic element to be produced. Incidentally, in this example and the other examples, to those semiconductor forming vacuum chambers in which no glow discharge is induced is supplied $H_2$ gas via the gas introducing pipes at 200 cm³/min (standard conditions). Each semiconductor forming vacuum chamber is provided with a film forming area adjuster plate, not shown, for adjusting the contact area between the conductive substrate 204 and the discharge space in each deposition chamber.

FIG. 3 is a schematic, cross-sectional view showing a photovoltaic element containing a deposited film formed in this example. In the figure, reference numeral 101 designates a substrate, 102 a semiconductor layer, 103 a transparent conductive layer, and 104 a collector electrode. Further, numeral 101-1 denotes a base member, 101-2 a metal layer, and 101-3 a metal oxide layer, and these are constitutive members of the substrate 101. The semiconductor layer 102 of this photovoltaic element is comprised of an amorphous n-type semiconductor layer 102-1A, an i-type semiconductor layer 102-2A comprising a crystalline phase, and a p-type semiconductor layer 102-3A comprising a crystalline phase. Namely, this photovoltaic element is a so-called pin type single cell photovoltaic element.

First, a substrate was prepared. A belt-like base member (50 cm wide, 200 m long, and 0.125 mm thick) of stainless steel (SUS430BA) was degreased and cleaned well, and was mounted in an unrepresented continuous sputtering system. A thin film of Ag (metal layer 101-2) was evaporated in the thickness of 100 nm on the base member by sputtering, using an Ag electrode as a target. Further, a thin film of ZnO (metal oxide layer 101-3) was evaporated in the thickness of 1.2 μm on the Ag thin film by sputtering, using a ZnO target, to obtain the belt-like conductive substrate 204.

A bobbin with the substrate 204 thereon was then mounted in the substrate feeding chamber 202, and the substrate 204 was guided through the entrance gas gate, the semiconductor forming vacuum chambers 211-216, and the exit gas gate to the substrate winding chamber 203. The belt-like substrate 204 was set at a ground potential and subjected to tension control so as to prevent the slack thereof. Then, the substrate feeding chamber 202, semiconductor forming vacuum chambers 211 to 216, and substrate winding chamber 203 were fully evacuated down to not more than 1.0 mPa by an evacuation system consisting of a vacuum pump not shown.

While actuating the evacuation system, the source gas and diluting gas was supplied through the gas introducing pipe 231, 232, 233, 234 and 236 into each semiconductor forming vacuum chamber 211, 212, 213, 214 and 216. At the same time, $H_2$ gas was supplied as gate gas at 500 cm³/min (standard conditions) into each gas gate through each gate gas supply pipe not shown. In this state the exhaust capability of the evacuation system was adjusted to control the pressures in the semiconductor forming vacuum chambers 211, 212, 213, 214 and 216 to predetermined pressures. The forming conditions were as presented in Table 1.

Next, after the pressures became stable in the semiconductor forming vacuum chambers 211, 212, 213, 214 and 216, the substrate 204 was started to move in the direction from the substrate feeding chamber 202 to the substrate winding chamber 203.

Then, the high-frequency waves were introduced from the high-frequency power supplies 251, 252, 253, 254 and 256 to the power applying electrodes 241, 242, 243, 244 and 246 in the semiconductor forming vacuum chambers 211, 212, 213, 214 and 216 to induce the glow discharge in the deposition chambers inside the semiconductor forming vacuum chambers 211, 212, 213, 214 and 216 thereby forming an amorphous n-type semiconductor layer (30 nm thick), an i-type semiconductor layer comprising a crystalline phase (1.5 um thick), and a p-type semiconductor layer comprising a crystalline phase (10 nm thick) on the substrate 204 to form a photovoltaic element.

At this time, the high-frequency power at the frequency of 13.56 MHz and in the power density of 5 mW/cm³ was introduced from the power applying electrode 241 consisting of a metal electrode of Al into the semiconductor forming vacuum chamber 211; the high-frequency power at the frequency of 60 MHz and in the power density of 400 mW/cm³ was introduced from the power applying electrodes 242, 243 and 244 each consisting of a metal electrode of Al into the semiconductor forming vacuum chambers 212, 213 and 214; the high-frequency power at the frequency of 13.56 MHz and in the power density of 30 mW/cm³ was introduced from the power applying electrode 246 consisting of a metal electrode of Al into the semiconductor forming vacuum chamber 216. The area of each of the metal electrodes facing the plasma surface was 50 cm×1 m, and the distance between each metal electrode and the substrate (hereinafter referred to as "CS distance") was set as shown in Table 1.

Next, by using a continuous modularizing apparatus not shown, the thus formed belt-like photovoltaic element was processed into a solar cell module of 36 cm×22 cm.

TABLE 1

| | | |
|---|---|---|
| Forming Conditions for Vacuum Chamber 211 | Source Gases | $SiH_4$: 20 cm³/min (normal*) $H_2$: 100 cm³/min (normal) $PH_3$ (Diluted to 2% with $H_2$): 30 cm³/min (normal) |
| | Substrate Temperature | 300° C. |
| | Pressure | 100 Pa |
| | CS Distance | 20 mm |
| Forming Conditions for Vacuum Chamber 212, 213 and 214 | Source Gases | $SiH_4$: 50 cm³/min (normal) $SiF_4$: 50 cm³/min (normal) $H_2$: 250 cm³/min (normal) |
| | Substrate Temperature | 300° C. |
| | Pressure | 100 Pa |
| | CS Distance | 10 mm |
| Forming Conditions for Vacuum Chamber 216 | Source Gases | $SiH_4$: 10 cm³/min (normal) $H_2$: 800 cm³/min. (normal) $BF_3$ (Diluted to 2% with $H_2$): 100 cm³/min (normal) |
| | Substrate Temperature | 200° C. |
| | Pressure | 150 Pa |
| | CS Distance | 20 mm |

*"normal" means the standard conditions.

Comparative Example 1-1

A solar cell module was prepared by following the same procedure as Example 1 with the exception that all the high-frequency power supplies were set so as to supply a high-frequency power of the frequency of 13.56 MHz.

Comparative Example 1-2

A solar cell module was prepared by following the same procedure as Example 1 with the exception that all the high-frequency power supplies were set so as to supply a high-frequency power of the frequency of 60 MHz.

Comparative Example 1-3

A solar cell module was prepared by following the same procedure as Example 1 with the exception that all the CS distances were set to be 10 mm.

Comparative Example 1-4

A solar cell module was prepared by following the same procedure as Example 1 with the exception that all the CS distances were set to be 20 mm.

With the solar cell modules prepared in Example 1 and Comparative Examples 1-1 to 1-4 as described above, their photoelectric conversion efficiencies were measured using a solar simulator (AM 1.5; 100 mW/cm$^2$). The results are shown in Table 2, in which "Ex." means "Example" and "Comp. Ex." means "Comparative Example", and the same applies to the subsequent tables. Further, in Table 2, the photoelectric conversion efficiencies were represented in terms of normalized values with the photoelectric conversion efficiency of Example 1 being 1.

TABLE 2

| | Ex. 1 | Comp. Ex. 1-1 | Comp. Ex. 1-2 | Comp. Ex. 1-3 | Comp. Ex. 1-4 |
|---|---|---|---|---|---|
| Photoelectric Conversion Efficiency | 1 | 0.95 | 0.93 | 0.95 | 0.98 |

In Comparative Example 1-1, when forming the i-type semiconductor layers using the semiconductor forming vacuum chambers 212, 213 and 214, higher film forming rates similar to that of Example 1 could not be obtained, and it was necessary for obtaining the predetermined film thicknesses to make the conveying speed of the substrate less than that for Example 1. Further, generation of by-products was observed in the deposition chambers, so that the frequency of necessary maintenance of the film forming apparatus was increased.

In Comparative Example 1-2, the photoelectric conversion efficiency was considerably smaller than that of Example 1. Especially, the open circuit voltage and fill factor were remarkably low.

In Comparative Example 1-3, when forming the p-type semiconductor layer using the semiconductor forming vacuum chamber 216, there was a region where the plasma was unstable, and the scattering in photoelectric conversion efficiency between samples was large.

In Comparative Example 1-4, when forming the i-type semiconductor layers using the semiconductor forming vacuum chambers 212, 213, 214, higher film forming rates similar to that of Example 1 could not be obtained, and it was necessary for obtaining the predetermined film thicknesses to make the conveying speed of the substrate less than that for Example 1.

It can be seen from the above that Example 1 is superior to Comparative Examples 1-1 to 1-4 in the characteristics of photoelectric conversion efficiency, throughput of preparation steps, and stability and uniformity of plasma.

Example 2

Figure 4:
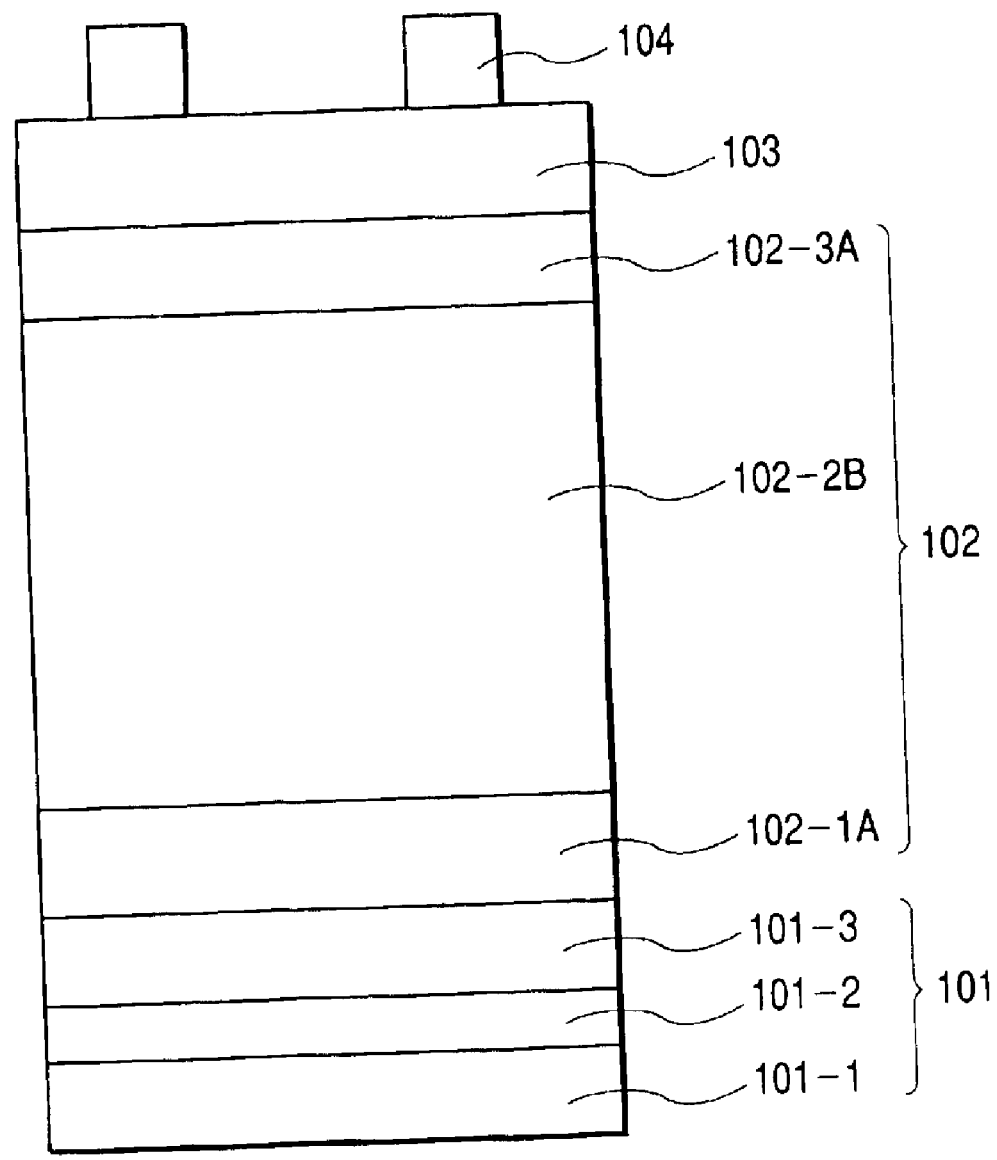
FIG. 4 is a schematic sectional view showing still another example of the photovoltaic element in accordance with the present invention.

Using the deposited film forming apparatus 201 shown in FIG. 2, a photovoltaic element of the configuration shown in FIG. 4 was formed according to the following procedures.

FIG. 4 is a schematic, cross-sectional view showing a photovoltaic element containing a silicon-based thin film of the present invention as formed in this example. For clarity, the same numerals are employed in FIG. 4 as employed in FIG. 3 for equivalent elements. The semiconductor layer 102 of this photovoltaic element is comprised of an amorphous n-type semiconductor layer 102-1A, an amorphous i-type semiconductor layer 102-2B, and a p-type semiconductor layer 102-3A comprising a crystalline phase.

A substrate 204 was prepared in the same manner as in Example 1, and an amorphous n-type semiconductor layer (30 nm thick), an amorphous i-type semiconductor layer (300 nm thick), and a p-type semiconductor layer comprising a crystalline phase (10 nm thick) were formed on the substrate 204 using the deposited film forming apparatus 201 to form a photovoltaic element. The forming conditions were as presented in Table 3.

At this time, the high-frequency power at the frequency of 13.56 MHz and in the power density of 5 mW/cm$^3$ was introduced from the power applying electrode 241 consisting of a metal electrode of Al into the semiconductor forming vacuum chamber 211; the high-frequency power at the frequency of 60 MHz and in the power density of 100 mW/cm$^3$ was introduced from the power applying electrodes 242, 243, 244 each consisting of a metal electrode of Al into the semiconductor forming vacuum chambers 212, 213 and 214; the high-frequency power at the frequency of 13.56 MHz and in the power density of 30 mW/cm$^3$ was introduced from the power applying electrode 246 consisting of a metal electrode of Al into the semiconductor forming vacuum chamber 216. The area of each of the metal electrodes facing the plasma surface was 50 cm×1 m, and the distance between each metal electrode and the substrate (hereinafter referred to as "CS distance") was set as shown in Table 3.

Next, by using a continuous modularizing apparatus not shown, the thus formed belt-like photovoltaic element was processed into a solar cell module of 36 cm×22 cm.

TABLE 3

| Forming Conditions for Vacuum Chamber 211 | Source Gases | SiH$_4$: 20 cm$^3$/min (normal*) |
| | | H$_2$: 100 cm$^3$/min (normal) |
| | | PH$_3$ (Diluted to 2% with H$_2$): 50 cm$^3$/min (normal) |
| | Substrate Temperature | 300° C. |
| | Pressure | 100 Pa |
| | CS Distance | 20 mm |
| Forming Conditions for Vacuum Chamber 212, 213 and 214 | Source Gases | Sih$_4$: 400 cm$^3$/min (normal) |
| | | H$_2$: 2000 cm$^3$/min (normal) |
| | Substrate Temperature | 300° C. |
| | Pressure | 300 Pa |
| | CS Distance | 12 mm |
| Forming Conditions for Vacuum Chamber 216 | Source Gases | SiH$_4$: 10 cm$^3$/min (normal) |
| | | H$_2$: 800 cm$^3$/min (normal) |
| | | BF$_3$ (Diluted to 2% with H$_2$): 100 cm$^3$/min (normal) |
| | Substrate Temperature | 200° C. |
| | Pressure | 150 Pa |
| | CS Distance | 20 mm |

*"normal" means the standard conditions.

Comparative Example 2-1

A solar cell module was prepared by following the same procedure as Example 2 with the exception that all the high-frequency power supplies were set so as to supply a high-frequency power of the frequency of 13.56 MHz.

Comparative Example 2-2

A solar cell module was prepared by following the same procedure as Example 2 with the exception that all the high-frequency power supplies were set so as to supply a high-frequency power of the frequency of 60 MHz.

Comparative Example 2-3

A solar cell module was prepared by following the same procedure as Example 2 with the exception that all the CS distances were set to be 12 mm.

Comparative Example 2-4

A solar cell module was prepared by following the same procedure as Example 2 with the exception that all the CS distances were set to be 20 mm.

With the solar cell modules prepared in Example 2 and Comparative Examples 2-1 to 2-4 as described above, their photoelectric conversion efficiencies were measured using a solar simulator (AM 1.5; 100 mW/cm$^2$). The results are shown in Table 4. In Table 4, the photoelectric conversion efficiencies were represented in terms of normalized values with the photoelectric conversion efficiency of Example 2 being 1.

TABLE 4

|  | Ex. 2 | Comp. Ex. 2-1 | Comp. Ex. 2-2 | Comp. Ex. 2-3 | Comp. Ex. 2-4 |
|---|---|---|---|---|---|
| Photoelectric Conversion Efficiency | 1 | 0.94 | 0.91 | 0.94 | 0.95 |

In Comparative Example 2-1, when forming the i-type semiconductor layers using the semiconductor forming vacuum chambers 212, 213, 214, higher film forming rates similar to that of Example 2 could not be obtained, and it was necessary for obtaining the predetermined film thicknesses to make the conveying speed of the substrate less than that for Example 2. Further, generation of by-products was observed in the deposition chambers, so that the frequency of necessary maintenance of the film forming apparatus was increased.

In Comparative Example 2-2, the photoelectric conversion efficiency was considerably smaller than that of Example 2. Especially, the open circuit voltage and fill factor were remarkably low.

In Comparative Example 2-3, when forming the p-type semiconductor layer using the semiconductor forming vacuum chamber 216, there was a region where the plasma was unstable, and the scattering in photoelectric conversion efficiency between samples was large.

In Comparative Example 2-4, when forming the i-type semiconductor layers using the semiconductor forming vacuum chambers 212, 213 and 214, higher film forming rates similar to that of Example 2 could not be obtained, and it was necessary for obtaining the predetermined film thicknesses to make the conveying speed of the substrate less than that for Example 2.

It can be seen from the above that Example 2 is superior to Comparative Examples 2-1 to 2-4 in the characteristics of photoelectric conversion efficiency, throughput of preparation steps, and stability and uniformity of plasma.

Examples 3-1, 3-2 and Comparative Examples 3-1, 3-2

Using the deposited film forming apparatus 201 shown in FIG. 2, photovoltaic elements of the configuration shown in FIG. 4 were formed according to the following procedures.

A substrate 204 was prepared in the same manner as in Example 2, and an amorphous n-type semiconductor layer (30 nm thick), an amorphous i-type semiconductor layer (300 nm thick), and a p-type semiconductor layer comprising a crystalline phase (10 nm thick) were formed on the substrate 204 using the deposited film forming apparatus 201 to form a photovoltaic element. At this time, four solar cell module samples (Examples 3-1, 3-2 and Comparative Examples 3-1, 3-2) were prepared by following the same procedure as Example 2 with the exception that, of the film forming conditions, the CS distances for the semiconductor forming vacuum chambers 211 and 216 were set as shown in Table 5.

Next, by using a continuous modularizing apparatus not shown, the thus formed belt-like photovoltaic element was processed into a solar cell module of 36 cm×22 cm.

With the solar cell modules prepared as described above, their photoelectric conversion efficiencies were measured using a solar simulator (AM 1.5; 100 mW/cm$^2$). The results are shown in Table 5. In Table 5, the photoelectric conversion efficiencies were represented in terms of normalized values with the photoelectric conversion efficiency of Example 2 being 1.

TABLE 5

|  | Comp. Ex. 3-1 | Ex. 3-1 | Ex. 2 | Ex. 3-2 | Comp. Ex. 3-2 |
|---|---|---|---|---|---|
| CS Distances for Vacuum Chambers 211 and 216 (mm) | 10 | 15 | 20 | 25 | 30 |
| Photoelectric Conversion Efficiency | 0.95 | 1.02 | 1 | 1.0 | 0.90 |

In Comparative Example 3-1, when forming the p-type semiconductor layer using the semiconductor forming vacuum chamber 216, there was a region where the plasma was unstable, and the scattering in photoelectric conversion efficiency between samples was large.

In Comparative Example 3-2, the open circuit voltage and fill factor were remarkably lower than those of Examples 3-1 and 3-2 to lower the photoelectric conversion efficiency. Further, when forming the n-type and the p-type semiconductor layers using the semiconductor forming vacuum chambers 211 and 216, higher film forming rates similar to those of Examples 3-1 and 3-2 could not be obtained, and it was necessary for obtaining the predetermined film thicknesses to make the conveying speed of the substrate less than those for Examples 3-1 and 3-2.

It can be seen from the above that Examples 3-1 and 3-2 are superior to Comparative Examples 3-1 and 3-2 in the characteristics of photoelectric conversion efficiency, throughput of preparation steps, and stability and uniformity of plasma.

Examples 4-1, 4-2 and Comparative Examples 4-1, 4-2

Using the deposited film forming apparatus 201 shown in FIG. 2, photovoltaic elements of the configuration shown in FIG. 4 were formed according to the following procedures.

A substrate 204 was prepared in the same manner as in Example 2, and an amorphous n-type semiconductor layer (30 nm thick), an amorphous i-type semiconductor layer (300 nm thick), and a p-type semiconductor layer comprising a crystalline phase (10 nm thick) were formed on the substrate 204 using the deposited film forming apparatus 201 to form a photovoltaic element. At this time, four solar cell module samples (Examples 4-1, 4-2 and Comparative Examples 4-1, 4-2) were prepared by following the same procedure as Example 2 with the exception that, of the film forming conditions, the CS distances for the semiconductor forming vacuum chambers 212, 213 and 214 were set as shown in Table 6.

Next, by using a continuous modularizing apparatus not shown, the thus formed belt-like photovoltaic element was processed into a solar cell module of 36 cm×22 cm.

With the solar cell modules prepared as described above, their photoelectric conversion efficiencies were measured using a solar simulator (AM 1.5; 100 mW/cm$^2$). The results are shown in Table 6. In Table 6, the photoelectric conversion efficiencies were represented in terms of normalized values with the photoelectric conversion efficiency of Example 2 being 1.

TABLE 6

|  | Comp. Ex. 4-1 | Ex. 4-1 | Ex. 2 | Ex. 4-2 | Comp. Ex. 4-2 |
| --- | --- | --- | --- | --- | --- |
| CS Distances for Vacuum Chambers 212, 213 and 214 (mm) | 3 | 5 | 12 | 15 | 20 |
| Photoelectric Conversion Efficiency | 0.91 | 1.0 | 1 | 0.98 | 0.93 |

In Comparative Example 4-1, when forming the i-type semiconductor layer using the semiconductor forming vacuum chambers 212, 213 and 214, there was a region where the plasma was unstable, and the scattering in photoelectric conversion efficiency between samples was large.

In Comparative Example 4-2, when forming the i-type semiconductor layers using the semiconductor forming vacuum chambers 212, 213 and 214, higher film forming rates similar to those of Examples 4-1 and 4-2 could not be obtained, and it was necessary for obtaining the predetermined film thicknesses to make the conveying speed of the substrate less than those for Examples 4-1 and 4-2.

It can be seen from the above that Examples 4-1 and 4-2 are superior to Comparative Examples 4-1 and 4-2 in the characteristics of photoelectric conversion efficiency, throughput of preparation steps, and stability and uniformity of plasma.

Example 5

Figure 5:
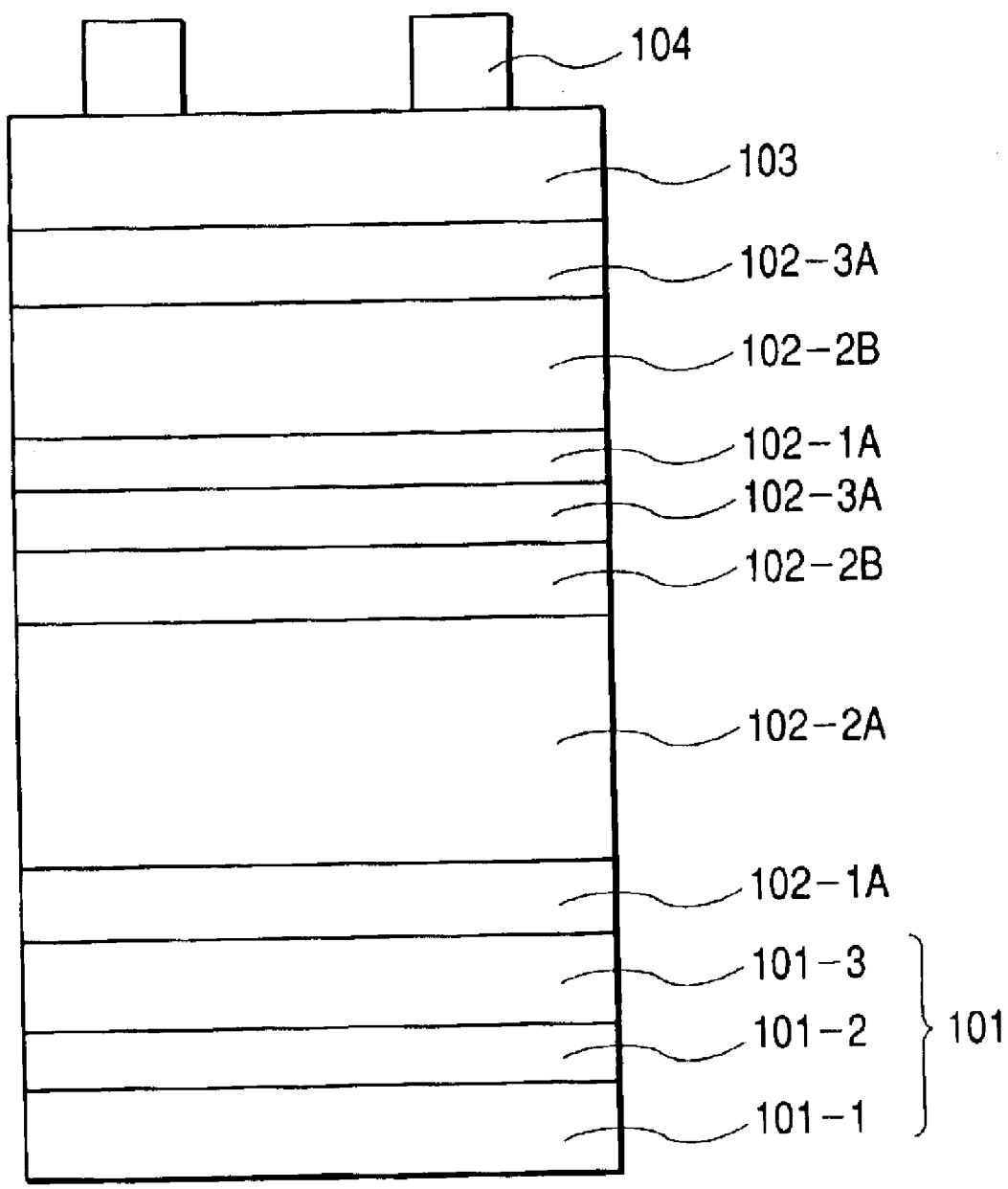
FIG. 5 is a schematic sectional view showing still another example of the photovoltaic element in accordance with the present invention.

Using the deposited film forming apparatus 201 shown in FIG. 2, a photovoltaic element of the configuration shown in FIG. 5 was formed according to the following procedures.

FIG. 5 is a schematic, cross-sectional view showing a photovoltaic element containing a silicon-based thin film of the present invention as formed in this example. For clarity, the same numerals are employed in FIG. 5 as are employed in FIG. 3 for equivalent elements. The semiconductor layer 102 of this photovoltaic element is comprised of an amorphous n-type semiconductor layer 102-1A, an i-type semiconductor layer 102-2A comprising a crystalline phase, an amorphous i-type semiconductor layer 102-2B, a p-type semiconductor layer 102-3A comprising a crystalline phase, an amorphous n-type semiconductor layer 102-1A, an amorphous i-type semiconductor layer 102-2B, and a p-type semiconductor layer 102-3A comprising a crystalline phase, which is the so-called stack cell with two sets of pin junctions.

A substrate 204 was prepared in the same manner as in Example 1, and an amorphous n-type semiconductor layer (30 nm thick), an i-type semiconductor layer comprising a crystalline phase (2.0 μm thick), an amorphous i-type semiconductor layer (10 nm thick), and a p-type semiconductor layer comprising a crystalline phase (10 nm thick) were formed on the substrate 204 using the deposited film forming apparatus 201 to form a first pin junction, and after the substrate was wound up in the substrate winding chamber 203 and a bobbin with the substrate wound thereon was mounted in the substrate feeding chamber 202, a similar procedure was performed to form an amorphous n-type semiconductor layer (30 nm thick), an amorphous i-type semiconductor layer (300 nm thick), and a p-type semiconductor layer comprising a crystalline phase (10 nm thick) thereon to form a second pin junction, thereby forming a photovoltaic element. The deposited film forming conditions are shown in Table 7.

At this time, when forming the first pin junction, the high-frequency power at the frequency of 13.56 MHz and in the power density of 5 mW/cm$^3$ was introduced from the power applying electrode 241 consisting of a metal electrode of Al into the semiconductor forming vacuum chamber 211; the high-frequency power at the frequency of 60 MHz and in the power density of 400 mW/cm$^3$ was introduced from the power applying electrodes 242, 243 and 244 each consisting of a metal electrode of Al into the semiconductor forming vacuum chambers 212, 213 and 214; the high-frequency power at the frequency of 13.56 MHz and in the power density of 5 mW/cm$^3$ was introduced from the power applying electrode 245 consisting of a metal electrode of Al into the semiconductor forming vacuum chamber 215; the high-frequency power at the frequency of 13.56 MHz and in the power density of 30 mW/cm$^3$ was introduced from the power applying electrode 246 consisting of a metal electrode of Al into the semiconductor forming vacuum chamber 216. The area of each of the metal electrodes facing the plasma surface was 50 cm×1 m, and the CS distances were set as shown in Table 7.

Further, when forming the second pin junction, the high-frequency power at the frequency of 13.56 MHz and in the power density of 5 mW/cm$^3$ was introduced from the power applying electrode 241 consisting of a metal electrode of Al into the semiconductor forming vacuum chamber 211; the high-frequency power at the frequency of 60 MHz and in the power density of 100 mW/cm$^3$ was introduced from the power applying electrodes 242, 243 and 244 each consisting of a metal electrode of Al into the semiconductor forming vacuum chambers 212, 213 and 214; the high-frequency power at the frequency of 13.56 MHz and in the power density of 5 mW/cm$^3$ was introduced from the power applying electrode 245 consisting of a metal electrode of Al into the semiconductor forming vacuum chamber 215; the high-frequency power at the frequency of 13.56 MHz and in the power density of 30 mW/cm$^3$ was introduced from the power applying electrode 246 consisting of a metal electrode of Al into the semiconductor forming vacuum chamber 216. The area of each of the metal electrodes facing the plasma surface was 50 cm×1 m, and the CS distances were set as shown in Table 7.

Next, by using a continuous modularizing apparatus not shown, the thus formed belt-like photovoltaic element was processed into a solar cell module of 36 cm×22 cm.

With the solar cell module prepared as described above, its photoelectric conversion efficiency was measured using a solar simulator (AM 1.5; 100 mW/cm$^2$).

It was found that the photoelectric conversion efficiency of this example was higher than those of Examples 1 and 2.

It can be seen from the above that this Example is excellent in the characteristics of photoelectric conversion efficiency, throughput of preparation steps, and stability and uniformity of plasma.

TABLE 7

(First pin junction)

| | | |
|---|---|---|
| Forming Conditions for Vacuum Chamber 211 | Source Gases | SiH$_4$: 20 cm$^3$/min<br>H$_2$: 100 cm$^3$/min<br>PH$_3$: 30 cm$^3$/min (Diluted to 2% with H$_2$) |
| | Substrate Temperature | 300° C. |
| | Pressure | 100 Pa |
| | CS Distance | 20 mm |
| Forming Conditions for Vacuum Chambers 212, 213 and 214 | Source Gases | SiH$_4$: 50 cm$^3$/min<br>SiF$_4$: 50 cm$^3$/min<br>H$_2$: 250 cm$^3$/min |
| | Substrate Temperature | 300° C. |
| | Pressure | 100 Pa |
| | CS Distance | 10 mm |
| Forming Conditions for Vacuum Chamber 215 | Source Gases | SiH$_4$: 10 cm$^3$/min<br>H$_2$: 100 cm$^3$/min |
| | Substrate Temperature | 300° C. |
| | Pressure | 100 Pa |
| | CS Distance | 20 mm |
| Forming Conditions for Vacuum Chamber 216 | Source Gases | SiH$_4$: 10 cm$^3$/min<br>H$_2$: 800 cm$^3$/min<br>BF$_3$: 100 cm$^3$/min (Diluted to 2% with H$_2$) |
| | Substrate Temperature | 200° C. |
| | Pressure | 150 Pa |
| | CS Distance | 20 mm |

(Second pin junction)

| | | |
|---|---|---|
| Forming conditions for Vacuum chamber 211 | Source Gases | SiH$_4$: 20 cm$^3$/min<br>H$_2$: 100 cm$^3$/min<br>PH$_3$: 50 cm$^3$/min (Diluted to 2% with H$_2$) |
| | Substrate Temperature | 300° C. |
| | Pressure | 100 Pa |
| | CS Distance | 20 mm |
| Forming conditions for Vacuum Chambers 212, 213 and 214 | Source Gases | SiH$_4$: 400 cm$^3$/min<br>H$_2$: 2000 cm$^3$/min |
| | Substrate Temperature | 300° C. |
| | Pressure | 300 Pa |
| | CS Distance | 12 mm |
| Forming conditions for Vacuum chamber 215 | Source Gases | SiH$_4$: 10 cm$^3$/min<br>H$_2$: 100 cm$^3$/min |
| | Substrate Temperature | 300° C. |
| | Pressure | 100 Pa |
| | cs Distance | 20 mm |
| Forming Conditions for Vacuum chamber 216 | Source Gases | SiH$^4$: 10 cm$^3$/min<br>H$_2$: 800 cm$^3$/min<br>BF$_3$: 100 cm$^3$/min (Diluted to 2% with H$_2$) |
| | Substrate Temperature | 200° C. |
| | Pressure | 150 Pa |
| | CS Distance | 20 mm |

*In Table 7, all the flow rates are represented in terms of values measured under standard conditions.

According to the present invention, as described above, when a plurality of silicon-based thin films are formed on a substrate using a plurality of deposited film forming vessels, silicon-based thin films of higher quality and excellent uniformity can be formed by supplying a high frequency power of a first frequency selected from the range between 30 MHz and 500 MHz to a power-applying electrode in a deposited film forming vessel wherein the distance between the power-supplying electrode and the substrate is 10 mm±5 mm, and by supplying a high frequency power of a second frequency selected from the range between 10 MHz and 30 MHz to a power-supplying electrode in a deposited film forming vessel wherein the distance between the power-supplying electrode and the substrate is 20 mm±5 mm; and by combining these silicon-based thin films, a semiconductor element having excellent characteristics can be realized.

What is claimed is:

1. An apparatus for forming a silicon-based thin film on a substrate using a plurality of deposited film forming vessels by a high-frequency plasma process, comprising a substrate and a high frequency applying electrode disposed in opposition to each other in each of the deposited film forming vessels, wherein the plurality of deposited film forming vessels including a first deposited film forming vessel having a first high-frequency applying electrode disposed so as to be distant by 10 mm±5 mm from the substrate and a first means for applying high-frequency waves of a first frequency selected from the range between 30 MHz and 500 MHz connected to the first high-frequency applying electrode, and a second deposited film forming vessel having a second high-frequency applying electrode disposed so as to be distant by 20 mm±5 mm from the substrate and a second means for applying high-frequency waves of a second frequency less than the first frequency selected from the range between 10 MHz and 30 MHz connected to the second high-frequency applying electrode.

2. The apparatus according to claim 1, which is provided with a roll-to-roll system in which a belt-like substrate is used as the substrate and the belt-like substrate is carried by rollers and transported.

3. A method of forming a silicon-based thin film on a substrate using a plurality of deposited film forming vessels by a high-frequency plasma process in a state such that the substrate and a high frequency applying electrode are disposed in opposition to each other in each of the deposited film forming vessels, the method comprising a first step of forming a deposited film while applying high-frequency waves of a first frequency selected from the range between 30 MHz and 500 MHz through a first high-frequency applying electrode disposed so as to be distant by 10 mm±5 mm from the substrate, and a second step of forming a deposited film while applying high-frequency waves of a second frequency less than the first frequency selected from the range between 10 MHz and 30 MHz through a second high-frequency applying electrode disposed so as to be distant by 20 mm±5 mm from the substrate.

4. The method according to claim 3, wherein a substantially intrinsic silicon-based thin film is formed in the first step.

5. The method according to claim 3, wherein a silicon-based thin film of n- or p-type conductivity is formed in the second step.

6. The method according to claim 3, wherein a substantially intrinsic silicon-based thin film is formed in the first step and a silicon-based thin film of n- or p-type conductivity is formed in the second step, thereby forming a pin-type semiconductor element on the substrate.

7. The method according to claim 3, which employs a roll-to-roll system in which a belt-like substrate is used as the substrate and the belt-like substrate is carried by rollers and transported.

8. A semiconductor element comprising a silicon-based thin film formed on a substrate, the silicon-based thin film being formed by a method of forming a silicon-based thin film on a substrate using a plurality of deposited film forming vessels by a high-frequency plasma process in a state such that the substrate and a high frequency applying electrode are disposed in opposition to each other in each of the deposited film forming vessels, comprising a first step of forming a deposited film while applying high-frequency waves of a first frequency selected from the range between 30 MHz and 500 MHz through a first high-frequency applying electrode disposed so as to be distant by 10 mm±5 mm from the substrate, and a second step of forming a deposited film while applying high-frequency waves of a second frequency less than the first frequency selected from the range between 10 MHz and 30 MHz through a second high-frequency applying electrode disposed so as to be distant by 20 mm±5 mm from the substrate.

9. The semiconductor element according to claim 8, wherein a substantially intrinsic silicon-based thin film is formed in the first step and a silicon-based thin film of n- or p-type conductivity is formed in the second step.

10. The semiconductor element according to claim 8, wherein the method of forming a silicon-based thin film employs a roll-to-roll system in which a belt-like substrate is used as the substrate and the belt-like substrate is carried by rollers and transported.

* * * * *